(12) United States Patent
I

(10) Patent No.: US 7,486,500 B2
(45) Date of Patent: Feb. 3, 2009

(54) ASSEMBLY STRUCTURE FOR ASSEMBLING A FIRST PLASTIC SHELL AND A SECOND PLASTIC SHELL

(75) Inventor: Ya-Tung I, Jhonghe (TW)

(73) Assignee: Lite-On Technology Corporation, Taipei (TW)

( * ) Notice: Subject to any disclaimer, the term of this patent is extended or adjusted under 35 U.S.C. 154(b) by 912 days.

(21) Appl. No.: 11/010,871

(22) Filed: Dec. 13, 2004

(65) Prior Publication Data

US 2006/0053623 A1    Mar. 16, 2006

(30) Foreign Application Priority Data

Sep. 10, 2004  (TW) .............................. 93127550 A

(51) Int. Cl.
  G06F 1/16   (2006.01)
  H05K 5/00   (2006.01)
  H05K 7/00   (2006.01)

(52) U.S. Cl. ........................................ 361/680; 29/757
(58) Field of Classification Search ................ 361/680, 361/658, 752; 29/757, 751, 729
See application file for complete search history.

(56) References Cited

U.S. PATENT DOCUMENTS

| 5,475,919 A | 12/1995 | Wu et al. ....................... 29/841 |
| 6,546,621 B2 | 4/2003 | Wang ........................... 29/841 |
| 7,187,540 B2 * | 3/2007 | Homer et al. ............... 361/681 |
| 2004/0120124 A1 * | 6/2004 | Cauwels ..................... 361/752 |

* cited by examiner

*Primary Examiner*—Hae Moon Hyeon
(74) *Attorney, Agent, or Firm*—Rosenberg, Klein & Lee

(57) ABSTRACT

An assembly structure for assembling a first plastic shell and a second plastic shell, thereby coupling articles to be assembled such as keyboards and adapters, including a hollow strut and an opening. The first plastic shell has the hollow strut extended from the inner side. The second plastic shell has the opening defined therein and corresponding to the hollow strut and extends inwards to form an annular flange abutting the hollow strut. The hollow strut has a portion extended through the annular flange to be melted by the ultrasonic welding technique, the thermal welding technique, or the combination thereof until reaching the annular flange, to couple the first and second plastic shells for facilitating assembly. Grinding off the melted portion may disassemble the first and second plastic shells. The disassembled the first and second plastic shells may be coupled again by fastening a fastening element in the hollow strut with the head of the fastening element held by the annular flange.

7 Claims, 3 Drawing Sheets

ASSEMBLY STRUCTURE FOR ASSEMBLING A FIRST PLASTIC SHELL AND A SECOND PLASTIC SHELL

FIELD OF THE INVENTION

The present invention relates to an assembly structure for articles requiring assemblage such as keyboards, adapters, and the like and particularly to a structure that employs the ultrasonic welding technique, the thermal welding technique, the combination thereof, or any other welding techniques to couple two plastic shells to facilitate assembling.

BACKGROUND OF THE INVENTION

There are many ways to assemble articles. The following uses a keyboard as an example for discussion. The keyboard is a data input device to function as a communication interface between users and a computer system. It consists of many keys that include character keys, direction keys and function keys and the like, for entering different data. The keyboard has many types. Most keyboard shells are assembled with tapping screws engaging apertures. While fastening by the tapping screws, the shells often deform due to torsion force and stress. Deformation is especially severe when the shells are lengthy. Even the gaps between the shells and the tapping screws result in a bad surge-test or a bad high-pressure-test. So fastening the shells by the tapping screws is not a facilitating way.

At present the technique of coupling through an ultrasonic welding process has been adopted in many areas. Reference can be found in U.S. Pat. Nos. 5,475,919 and 6,546,621.

U.S. Pat. No. 6,546,621 entitled "Package structure and method for a card" teaches a technique, which couples a first conductive cover and a second conductive cover with a first plastic frame and a second plastic frame by ultrasonic welding, to form a first half case and a second half case. U.S. Pat. No. 5,475,919 entitled "PCMCIA card manufacturing process" also adopts the ultrasonic welding technique to couple an upper plastic case with a lower plastic case. However, the product coupled by the ultrasonic welding technique has one problem, i.e. when it is disassembled for repairs, the welding structure is destroyed and the plastic cases have to be discarded. This results in wasting of costs.

SUMMARY OF THE INVENTION

An advantageous feature of the preferred embodiments of the present invention is to provide an assembly structure for assembling a first plastic shell and a second plastic shell that employs the ultrasonic welding technique, the thermal welding technique, or the combination thereof, to couple and assemble articles (such as keyboards, adapters, and the like.

The assembly structure for assembling a first plastic shell and a second plastic shell of the invention includes a hollow strut and an opening. The first plastic shell has the hollow strut extended from an inner side. The second plastic shell has an opening defined therein and corresponding to the hollow strut and is extended inwards to form an annular flange abutting the hollow strut. The hollow strut has a portion extended through the annular flange. After fused by the ultrasonic welding technique, the thermal welding technique, or the combination thereof, the portion of the hollow strut that is extended through the annular flange is melted on the annular flange to couple the first plastic shell and the second plastic shell together.

The annular flange can prevent the melted portion from flowing into the first and second plastic shells or from flowing to other places while melting of the melted portion. Disassembly of the first and second plastic shells may be accomplished by grinding off the melted portion. Then a fastening element, such as a tapping screw, may be used to run through the hollow strut to couple the first and second plastic shells again, while the head of the tapping screw is held by the annular flange.

The foregoing, of course, may possess none, one, some, or all of these technical features and/or additional technical features. Other technical features will be readily apparent to those skilled in the art from the following figures, detailed description, and/or claims.

DESCRIPTION OF THE PREFERRED EMBODIMENTS

The present invention aims to provide an assembly structure for assembling a first plastic shell and a second plastic shell, which uses the ultrasonic welding technique, the thermal welding technique, the combination thereof, or other techniques that can weld two plastic shells, to couple and assemble the two plastic shells for facilitating assemblage of an article. After the plastic shells have been disassembled, they can be assembled again and reused. The article that consists of two plastic shells may be a keyboard, an adapter or the like.

Figure 1A:
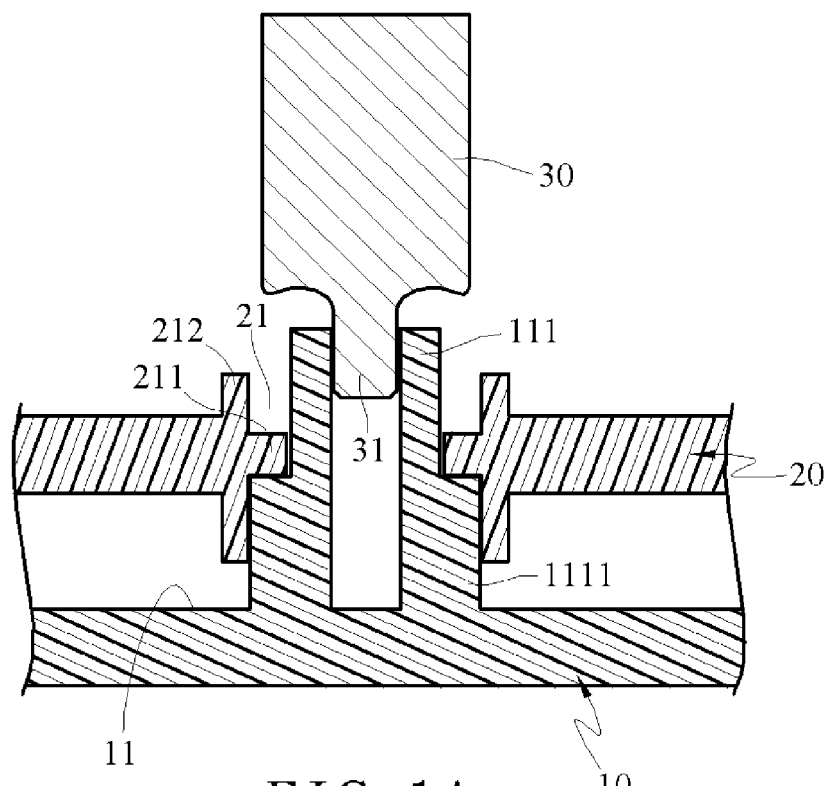
FIG. 1A is a schematic view of a first embodiment of the invention before coupling by the ultrasonic welding technique, the thermal welding technique, or the combination thereof.
Figure 1B:
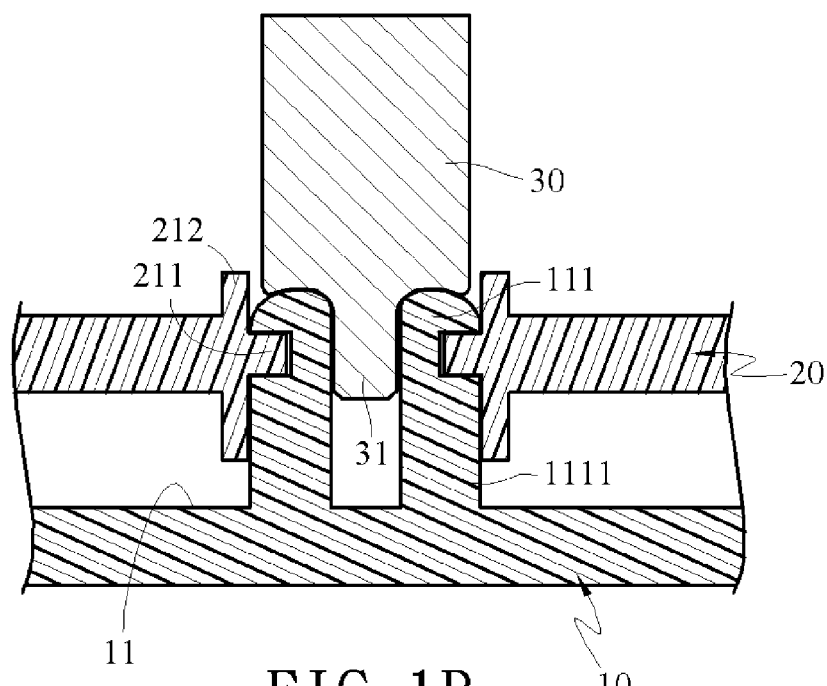
FIG. 1B is a schematic view of the first embodiment after it has been coupled.

Refer to FIG. 1A for a first embodiment of the invention before coupling by the ultrasonic welding technique, the thermal welding technique, or the combination thereof, and FIG. 1B after the first embodiment has been coupled. The assembly structure for assembling a first plastic shell and a second plastic shell according to the invention includes a hollow 111 strut and an opening 21. In detail, the first plastic shell 10 has the hollow strut 111 extended from an inner side 11. The hollow strut 111 has a retaining section 1111. The second plastic shell 20 has the opening 21 defined therein and corresponding to the hollow strut 111. The opening 21 is extended inwards to form an annular flange 211 abutting the hollow strut 111. The hollow strut 111 may be extended through the annular flange 211 with the annular flange 211 held by the retaining section 1111. The periphery of the opening 21 further is extended outwards to form an annular retaining wall 212. After being fused by the ultrasonic welding technique, the thermal welding technique, or the combination thereof, a portion of the hollow strut 111 that is extended through the annular flange 211 is melted on the annular flange 211, to couple the first plastic shell 10 and the second plastic shell 20 together.

In the process of assembling the first plastic shell 10 and the second plastic shell 20, first, have a portion of the hollow strut 111 running through the opening 21 close to the annular flange 211 until the annular flange 211 is stopped by the retaining section 1111. Then move a mold 30 to the hollow strut 111 to melt the extended portion of the hollow strut 111 until reaching the annular flange 211 to couple the first plastic shell 10 and the second plastic shell 20 together. To prevent the melting plastics from flowing to other places, the following designs may be adopted, such as the mold 30 having a retaining portion 31 to run through the hollow strut 111 to prevent the melted portion from flowing into the hollow strut 111, the annular flange 211 being able to prevent the melted portion from flowing into the first plastic shell 10 and the second plastic shell 20, and the annular retaining wall 212 being able to prevent the melted portion from flowing outside.

Figure 1C:
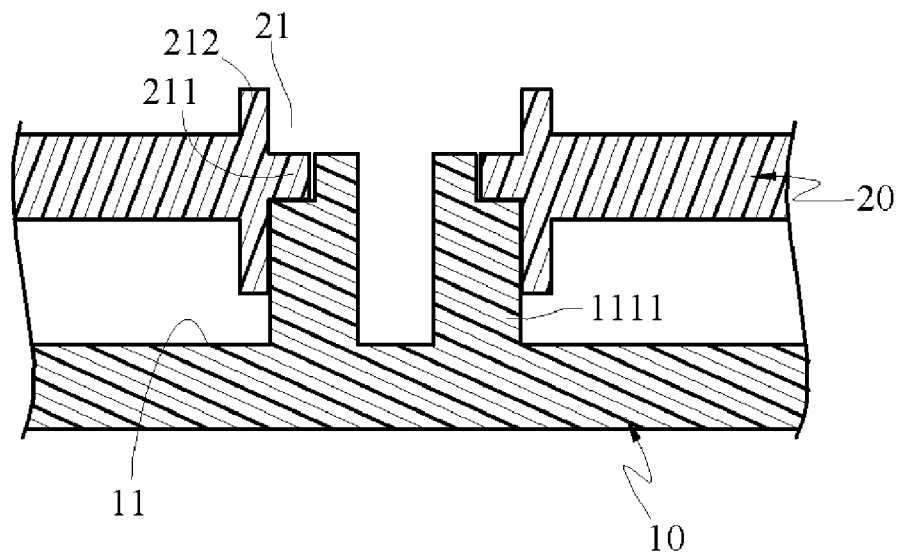
FIG. 1C is a schematic view of the first embodiment of the invention after the melted portion has been ground.
Figure 1D:
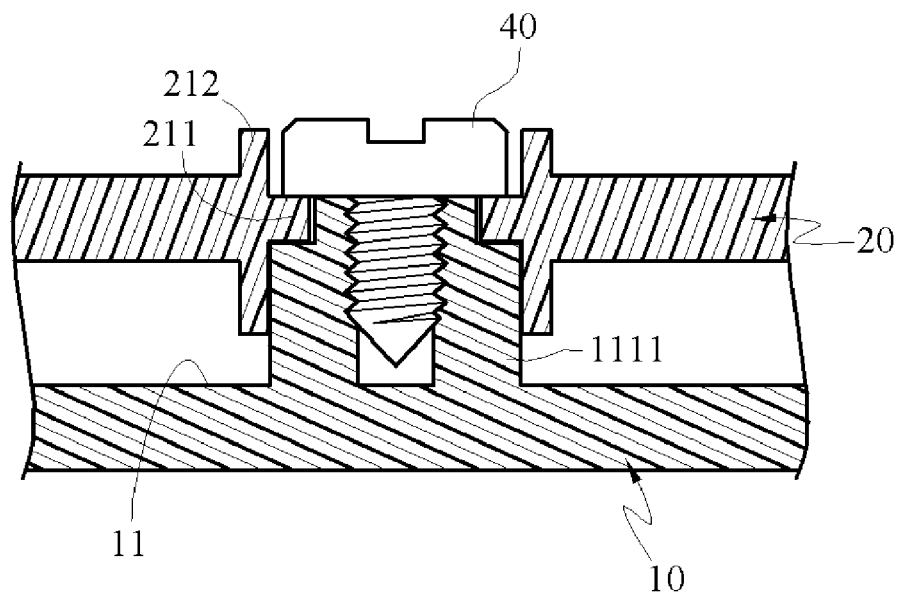
FIG. 1D is a schematic view of the first embodiment of the invention after it has been re-coupled by a fastening element.

Disassembly of the first plastic shell 10 and the second plastic shell 20 may be accomplished by grinding off the melted portion (shown in FIG. 1C). Then a fastening element such as a tapping screw 40 may be used to run through the hollow strut 111, to couple the first plastic shell 10 and the second plastic shell 20 again (shown in FIG. 1D), while the head of the tapping screw is held by the annular flange 211.

Figure 2A:
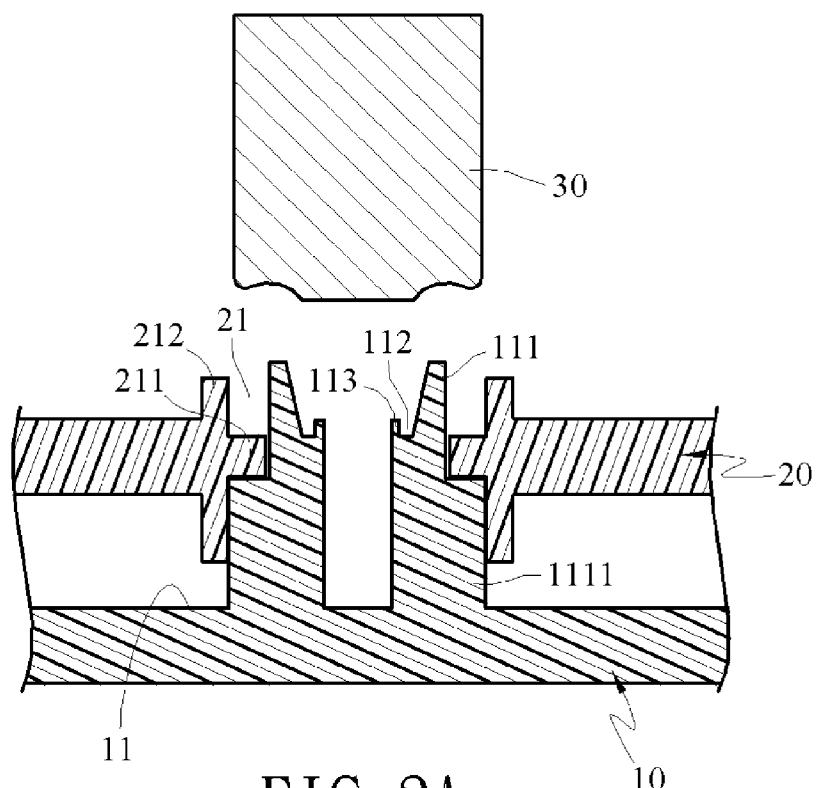
FIG. 2A is a schematic view of a second embodiment of the invention before coupling by the ultrasonic welding technique, the thermal welding technique, or the combination thereof.
Figure 2B:
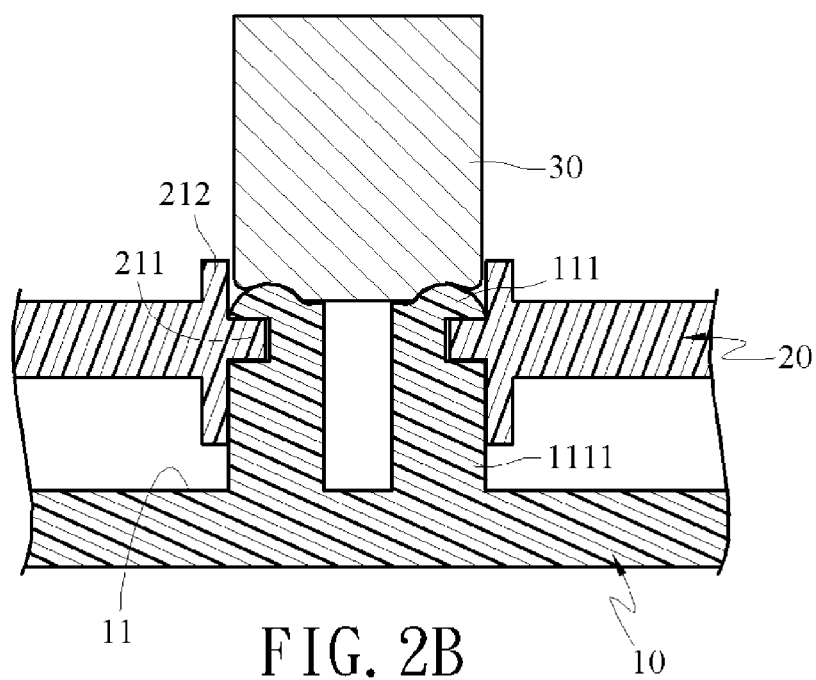
FIG. 2B is a schematic view of the second embodiment after it has been coupled.

Refer to FIG. 2A for a second embodiment of the invention before coupling by the ultrasonic welding technique, the thermal welding technique, the combination thereof, and FIG. 2B after the second embodiment has been coupled. The assembly structure for assembling a first plastic shell and a second plastic shell according to the invention includes a hollow 111 strut and an opening 21. In detail, the first plastic shell 10 has the hollow strut 111 extended from an inner side 11. The hollow strut 111 has a smaller thickness on the upper edge and becomes gradually thicker toward the inner side 11 to form a trench 112 on the thicker portion with an annular wall 113 extended outwards from the inner periphery. The second plastic shell 20 has the opening 21 defined therein and corresponding to the hollow strut 111. The opening 21 is extended inwards to form an annular flange 211 abutting the hollow strut 111. The hollow strut 111 may be extended through the annular flange 211 with the annular flange 211 retained by the retaining section 1111. The periphery of the opening 21 further is extended outwards to form an annular retaining wall 212. After being fused by the ultrasonic welding technique, the thermal welding technique, or the combination thereof, the portion of the hollow strut 111 that is extended through the annular flange 211 is melted on the annular flange 211, to couple the first plastic shell 10 and the second plastic shell 20 together.

In the process of assembling the first plastic shell 10 and the second plastic shell 20, first, have a portion of the hollow strut 111 running through the opening 21 close to the annular flange 211 until the annular flange 211 is stopped by the retaining section 1111. Then move a mold 30 to the hollow strut 111 to melt the extended portion of the hollow strut 111 until reaching the annular flange 211, to couple the first plastic shell 10 and the second plastic shell 20 together. To prevent the melting plastics from flowing to other places, the following designs may be adopted, such as making the melted portion flow into the trench 112 without flowing into the hollow strut 111, the annular flange 211 being able to prevent the melted portion from flowing into the first plastic shell 10 and the second plastic shell 20, and the annular retaining wall 212 being able to prevent the melted portion from flowing outside.

Disassembly of the first plastic shell 10 and the second plastic shell 20 may be accomplished by grinding off the melted portion. Then a fastening element such as a tapping screw may be used to run through the hollow strut, to couple the first plastic shell 10 and the second plastic shell 20 again (not shown in the drawing), while the head of the tapping screw is held by the annular flange 211.

In addition, when the sizes of the first plastic shell 10 and the second plastic shell 20 are not very large, the retaining structure interposed between the first plastic shell 10 and the second plastic shell 20 may be omitted. Once melted, the portion of the hollow strut 111 extended outside the opening 21 is melted until reaching the edge of the opening 21, to couple the first plastic shell 10 and the second plastic shell 20. After grinding off the melted portion of the hollow strut 111, the first plastic shell 10 and the second plastic shell 20 may be disassembled. A fastening element (not shown in the drawings) may be used to run through the hollow strut 111, to couple the first plastic shell 10 and the second plastic shell 20 again.

When the retaining structure, which is on the first plastic shell 10 or the second plastic shell 20, is built-in around the opening 21 the additional retaining structure may also be omitted.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. An assembly structure for assembling a first plastic shell and a second plastic shell, the assembly structure comprising:
a hollow strut is extended from an inner side of the first plastic shell; and
an opening defined in the second plastic shell corresponding to the hollow strut;
whereby the hollow strut has a portion which is extended through the opening and which is melted when heated to form a melted portion to couple the first plastic shell and the second plastic shell, wherein to disassemble the first plastic shell and the second plastic shell the melted portion is removable by grinding, and reassembling of the disassembled first plastic shell and the second plastic shell is accomplished by fastening a fastening element in the hollow strut.

2. The assembly structure for assembling a first plastic shell and a second plastic shell of claim 1, wherein the opening is extended inwards to form an annular flange abutting the hollow strut, the portion of the hollow strut running through the opening being melted by heat until reaching the annular flange to couple the first plastic shell and the second plastic shell.

3. The assembly structure for assembling a first plastic shell and a second plastic shell of claim 1, wherein the periphery of the opening is extended outwards to form an annular retaining wall.

4. The assembly structure for assembling a first plastic shell and a second plastic shell of claim 1, wherein the hollow strut has a smaller thickness on an upper edge and gradually thickens towards the inner side to form a trench which has an inner side extended outwards to form an annular wall.

5. The assembly structure for assembling a first plastic shell and a second plastic shell of claim 1, wherein the hollow strut has a retaining section to stop the annular flange.

6. The assembly structure for assembling a first plastic shell and a second plastic shell of claim 1, wherein the fastening element is a tapping screw.

7. The assembly structure for assembling a first plastic shell and a second plastic shell of claim 1, wherein the hollow strut is melted by ultrasonic welding, thermal welding or combination thereof.

* * * * *